United States Patent [19]

Grasser

[11] Patent Number: 4,518,630

[45] Date of Patent: May 21, 1985

[54] METHOD FOR FORMING SILICON OXIDE FILMS

[75] Inventor: Leo Grasser, Munich, Fed. Rep. of Germany

[73] Assignee: Siemens AG, Berlin and Munich, Fed. Rep. of Germany

[21] Appl. No.: 465,530

[22] Filed: Feb. 10, 1983

[30] Foreign Application Priority Data

Feb. 22, 1982 [DE] Fed. Rep. of Germany ....... 3206376

[51] Int. Cl.$^3$ ............................................... B05D 5/12
[52] U.S. Cl. ........................................ 427/93; 427/96; 427/255; 427/255.3; 427/255.4
[58] Field of Search ................... 427/255, 255.3, 255.4, 427/255.7, 399, 96, 93, 255.1

[56] References Cited

U.S. PATENT DOCUMENTS

| Re. 28,385 | 4/1975 | Mayer | 427/255.4 |
|---|---|---|---|
| 3,837,905 | 9/1974 | Hile et al. | 427/255.4 |
| 4,268,538 | 5/1981 | Toole et al. | 427/255.4 |
| 4,275,094 | 6/1981 | Takagi et al. | 427/255.4 |
| 4,293,589 | 10/1981 | Takagi et al. | 427/255.4 |
| 4,293,590 | 10/1981 | Takagi et al. | 427/255.4 |

OTHER PUBLICATIONS

Osburn, "Dielectric Breakdown Properties of $SiO_2$ Film Grown in Halogen and Hydrogen-Containing Environments", *J. Electrochem. Soc.*, vol. 21, No. 6, pp. 809-814, Jun. 1974.
Hashimoto et al., "A Method of Forming Thin & Highly Reliable Gate Oxides", pp. 129-135, *J. Electrochem. Soc.*, Jan. 1980.

*Primary Examiner*—Sadie L. Childs
*Attorney, Agent, or Firm*—Herbert L. Lerner; Laurence A. Greenberg

[57] ABSTRACT

Method for forming silicon oxide layers on silicon surfaces with at least two oxidation steps, in which a first step ($B_1$) is performed at a low oxidation temperature ($T_1$) in an atmosphere containing a mixture of oxygen and hydrogen chloride with a low hydrogen chloride concentration, and in which a second step ($B_3$) is performed at a high oxidation temperature ($T_2$), characterized by the feature that the second step ($B_3$) is performed in a dry oxygen atmosphere. An intermediate step ($B_2$) may also be employed for heating from the low temperature to the high temperature.

7 Claims, 1 Drawing Figure

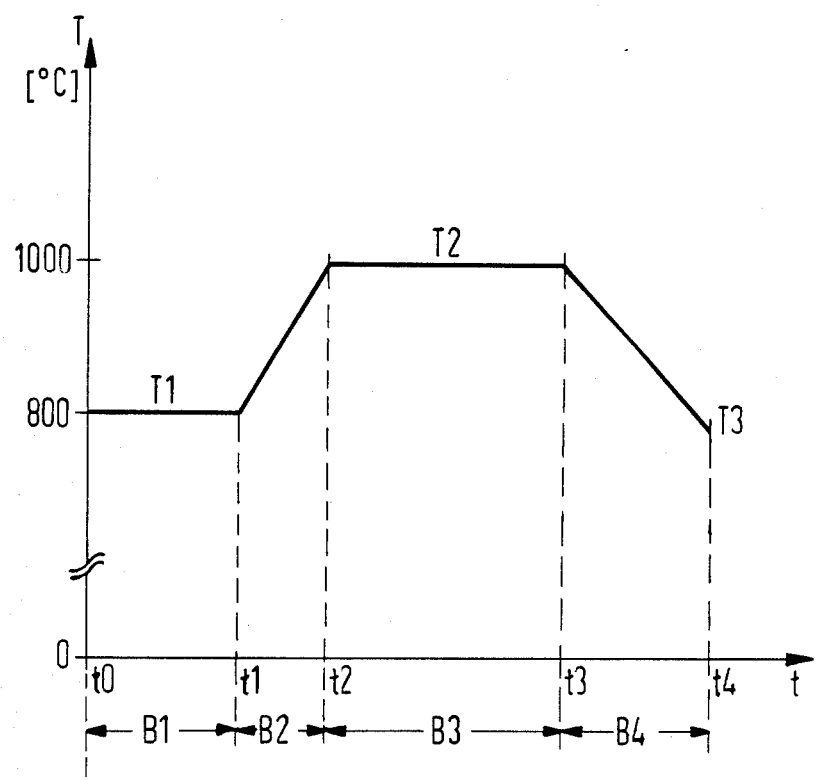

METHOD FOR FORMING SILICON OXIDE FILMS

BACKGROUND OF THE INVENTION

1. Field of the Invention

The invention relates to a method for the preparation of silicon oxide films on silicon surfaces with at least two oxidation steps, in which a first step is performed at a low oxidation temperature in an atmosphere containing a mixture of oxygen and hydrogen chloride with a low hydrogen chloride concentration, and in which a second step is carried out at a high oxidation temperature.

2. Description of the Prior Art

In the fabrication of large-scale integrated circuits in MOS technology, small oxide thicknesses of high quality are required for the gate oxides particularly where the oxide layers applied to a semiconductor surface should have above all a uniform and reproducible thickness, a high breakdown voltage, a low defect density, small surface charges and good passivation.

High oxide quality can be obtained by very elaborate purification processes; otherwise, it is known to perform the oxidation of silicon surfaces in a gas mixture of oxygen and hydrogen chloride. In the latter method, however, low oxidation temperatures result in low defect rates and poor passivation, and high oxidation temperatures in high defect rates and good passivation.

The quality of thin silicon oxide films may be improved by a two-step oxidation process of the type mentioned at the outset described in the article "A Method of Forming Thin and Highly Reliable Gate Oxides" by C. Hashimoto, S. Muramoto, N. Shiono and O. Nakajima, Journal of the Electrochemical Society, January 1980, pages 129–135. In this process one works in the first oxidation step with an oxygen/hydrogen chloride mixture with a relatively low hydrogen chloride concentration and relatively low temperature, and in the second oxidation step with a relatively high temperature and a gas mixture of nitrogen, oxygen and hydrogen chloride. Mixing these three gases in the second oxidation step, however, is a disadvantage particularly because the nitrogen content of the three gases is more than 90% by volume, and since the gas components do not mix homogeneously, the individual components are not distributed simultaneously on the semiconductor wafer. This leads, particularly at the boundary surface between silicon and silicon dioxide, to silicon nitrite layers which degrade the long-term behavior of the oxide layers. The high oxidation temperatures of 900° to 1100° C. in the first step and above 1100° C. in the second step further degrade, through unavoidable diffusion processes, the semiconductor properties of semiconductor wafers already doped prior to the oxidation. Lower oxidation temperatures, however lead with the mentioned gas mixture to long oxidation times.

SUMMARY OF THE INVENTION

An object of the invention is to provide a method for forming thin silicon oxide films of improved quality on silicon surfaces. With the foregoing and other objects in view, there is provided in accordance with the invention a method for forming silicon oxide layers on silicon surfaces which comprises subjecting the silicon surface to at least two oxidation steps in which in a first step the silicon surface is subjected to an atmosphere containing a mixture of oxygen and HCl with a low HCl concentration at a low oxidation temperature, and in a second step the silicon from the first step is subjected to a high oxidation temperature, the improvement comprising effecting the oxidation in the second step in a dry oxygen atmosphere.

Other features which are considered as characteristic for the invention are set forth in the appended claims.

Although the invention is illustrated and described herein as embodied in a method for forming silicon oxide films, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawing which shows a temperature-time diagram of an embodiment example of the method according to the invention. The silicon wafer surface is oxidized in a first step in an atmosphere of dry oxygen with a low concentration of HCl at a low oxidation temperature. The wafer is heated to a high oxidation temperature in an intermediate step. The wafer is heated in a third step at the high temperature in an atmosphere of oxygen. This is followed by a cooling down step either under a nitrogen atmosphere or a rare gas atmosphere.

DETAILED DESCRIPTION OF THE INVENTION

In the method according to the invention, the second step is carried out in a dry oxygen atmosphere. Thereby the instantaneous as well as the time-dependent breakdown behavior of the oxide layers are improved.

A further improvement of the quality of the oxide is achieved by increasing the oxidation temperature from the low oxidation temperature in the first step to the high oxidation temperature of the later step, by means of an intermediate step in an atmosphere which contains a mixture of oxygen and hydrogen chloride with a low hydrogen chloride concentration.

The invention will be explained in greater detail in the following, with reference to the drawing showing a temperature-time diagram of an embodiment example of the method according to the invention.

In the first oxidation step $B_1$, the silicon material to be oxidized, for instance, silicon wafers, is oxidized in a furnace, such as an oxidizing tube, at a low oxidation temperature $T_1$ in an atmosphere containing a mixture of oxygen and hydrogen chloride. Advantageously, the oxidizing tube is first flushed with this gas mixture, and after the flushing, the material to be oxidized including holders (trays) is placed in the oxidizing tube and likewise flushed with the gas mixture to be passed through the tube at the temperature $T_1$. The gas mixture consists of dry oxygen with a low hydrogen chloride concentration, preferably 2.5 to 4 and in particular, 3 volume percent hydrogen chloride (HCl). The temperature $T_1$ is in the range of 700° to 900° C., preferably 750° to 850° C. and in particular, 800° C. After 15 to 45 and preferably 25 to 35 minutes (time $t_1$), an oxide thickness of less than 1 nm is obtained, with a well-cleaned silicon surface.

The intermediate step $B_2$ which follows the first step $B_1$ and serves for heating the oxidizing tube from the low oxidizing temperature $T_1$ to the high oxidizing temperature $T_2$, is advantageously carried out in an atmosphere corresponding to the atmosphere used in the first step $B_1$. Due to the HCl content of the atmosphere, contamination of the oxide layers, especially by impurities present in the oxidizing tube, is avoided during the heating-up time. The length of the intermediate step $B_2$ (time $t_2$- time $t_1$) is advantageously 15 to 30 minutes and the oxide thickness obtained is about 1 nm. However, the intermediate step $B_2$ can also be carried out without the admixture of HCl. In the second step designated $B_3$ following the intermediate step $B_2$, oxidation is performed at a high oxidizing temperature $T_2$ in an atmosphere of pure dry oxygen. The length of the second step $B_3$ (time $t_3$ minus time $t_2$) depends on the total oxide thickness desired. For gate oxide thicknesses of $45 \pm 3$ nm, such as are required in the manufacture of 64-k RAMs, the length of time of the second step $B_3$ is, for instance, 25 minutes. The level of the high oxidizing temperature $T_2$ is approximately in the range between 850° and 1050° C. and preferably, between 900° and 1000° C. Temperatures $T_2$ in the lower part of the mentioned ranges are of advantage for generating small oxide thicknesses in the range between 5 and 10 nm, since at low oxidizing temperatures, oxide thicknesses desired for manufacturing reasons can be produced more accurately because of the longer oxidizing time.

Due to the first step $B_1$, a very clean interface is prepared when the time reaches $t_2$. Because of the passivation performed by the second step $B_3$, there are only few mobile charge carriers in the oxide.

After the desired oxide thickness is reached (time $t_3$), the furnace is allowed to cool down slowly to at least 850° C. (temperature $T_3$) in the following cooling step $B_4$ and the oxidized material is subsequently taken out (time $t_4$). The cooling-down phase (time $t_4$ minus time $t_3$) is preferably carried out in one to two hours during a cooling-down phase, using a nitrogen atmosphere.

In order to avoid forming nitrogen compounds which possibly might be caused by the nitrogen atmosphere, it has been found that cooling down in an atmosphere containing a rare gas, for instance, an argon atmosphere is particularly advantageous for obtaining high oxide qualities. If a rare gas atmosphere is used, the cooling-down phase is less critical. Advantageously, the oxidized material is cooled down to 700° to 800° C.

In an embodiment example, homogeneous p-conduction silicon wafers with a diameter of about 100 mm were used as the starting material, the resistivity of which was about 10 ohm cm. The oxidations were carried out in a computer-controlled quartz oxidizing tube with a constant-temperature-time program corresponding to that shown in the drawing. Wafers with oxide thicknesses of 50 nm were obtained. The temperatures were: $T_1 = 800°$ C., $T_2 = 1000°$ C. and $T_3 = 800°$ C. The hydrogen chloride concentrations during the first step $B_1$ and the intermediate step $B_2$ were 3 volume percent; the cooling-down step $B_4$ took place in a nitrogen atmosphere. The length of the first step $B_1$ was 30 minutes, that of the intermediate step $B_2$, 20 minutes, that of the second step $B_3$, 25 minutes and that of the cooling-down step $B_4$, 100 minutes.

In order to measure the breakdown voltages of the oxide films for the quality test, aluminum silicon was sputtered on the silicon dioxide on the entire surface with a thickness of about 1 nm. The metal layer was subsequently subdivided photo-lithographically into rectangles with an area of 25 mm$^2$ and then, the oxide on the back of the wafers was removed. As the final process, hydrogen annealing at 450° C. for 30 minutes followed.

For the instantaneous oxide breakdown, which was measured on about 1500 MOS capacitors, a 50% value of 50 V was found for the breakdown voltage after compilation and statistical evaluation with a standard deviation $+\sigma$ of 1 V and $-\sigma$ of 6 V. In MOS capacitors made according to the state of the art, on the other hand, corresponding values obtained were of 40 V (50% value), 3 V ($+1\sigma$) and 7 V ($-1\sigma$).

The time-dependent oxide breakdown was likewise measured on about 1500 capacitors. All capacitors were stressed with a field strength of 6 MV/cm. The measured failure rate due to oxide breakdowns between the beginning and the end of the stress period ($10^{-6}$ seconds to 1000 hours) was 12%, while the failure rate within the time given was about 42% in capacitors made according to the state of the art.

The foregoing is a description corresponding to German Application No. P 32 06 376.8, dated February 22, 1982, international priority of which is being claimed for the instant application, and which is hereby made part of this application. Any discrepancies between the foregoing specification and the aforementioned corresponding German application are to be resolved in favor of the latter.

There is claimed:

1. Method for forming silicon oxide layers on silicon surfaces which comprises subjecting the silicon surface to at least two oxidation steps; (a) a first oxidation step carried out at a low oxidation temperature in the range of 700° C. to 900° C. in an atmosphere containing a mixture of oxygen and hydrochloric acid with a low hydrochloric acid concentration, (b) a second oxidation step carried out at a higher oxidation temperature of at least 100° C. above the low oxidation temperature of the first step and within the temperature range of 850° C. to 1050° C., and in a dry oxygen atmosphere, (c) an intermediate step between step (a) and step (b) wherein the oxidation temperature is increased from the low oxidation temperature of step (a) to the high oxidation temperature of step (b), in an atmosphere containing a mixture of oxygen and hydrochloric acid with a low hydrochloric acid concentration, and (d) immediately after the second oxidation step (b) carrying out a cooling-down step to cool down the silicon oxide on the silicon surface.

2. Method according to claim 1, wherein in the first step (a) the hydrochloric acid concentration is 2.5 to 4 volume %.

3. Method according to claim 1, wherein the first step (a) is carried out at an oxidation temperature of about 750° C. to 850° C.

4. Method according to claim 2, wherein the first step (a) is carried out at an oxidation temperature of about 750° C. to 850° C.

5. Method according to claim 1, wherein the second step (b) is carried out at an oxidation temperature of about 900° C. to 1000° C.

6. Method according to claim 2, wherein the second step (b) is carried out at an oxidation temperature of about 900° C. to 1000° C.

7. Method according to claim 3, wherein the second step (b) is carried out at an oxidation temperature of about 900° C. to 1000° C.

* * * * *